(12) United States Patent
Pidaparthi et al.

(10) Patent No.: US 12,484,294 B2
(45) Date of Patent: Nov. 25, 2025

(54) VERTICAL FIN-BASED FIELD EFFECT TRANSISTOR (FINFET) WITH NEUTRALIZED FIN TIPS

(71) Applicant: SEMICONDUCTOR COMPONENTS INDUSTRIES, LLC, Scottsdale, AZ (US)

(72) Inventors: Subhash Srinivas Pidaparthi, Santa Clara, CA (US); Clifford Drowley, Santa Clara, CA (US); Shahin Sharifzadeh, Santa Clara, CA (US); Andrew P. Edwards, Santa Clara, CA (US); Andrew Walker, Santa Clara, CA (US); Francis Chai, Santa Clara, CA (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 438 days.

(21) Appl. No.: 18/097,693

(22) Filed: Jan. 17, 2023

(65) Prior Publication Data

US 2023/0246027 A1    Aug. 3, 2023

Related U.S. Application Data

(60) Provisional application No. 63/304,512, filed on Jan. 28, 2022.

(51) Int. Cl.
*H10D 84/83* (2025.01)
*C30B 29/40* (2006.01)
(Continued)

(52) U.S. Cl.
CPC ......... *H10D 84/834* (2025.01); *C30B 29/403* (2013.01); *H10D 30/024* (2025.01);
(Continued)

(58) Field of Classification Search
CPC .... C30B 29/403; C30B 25/04; H10D 30/024; H10D 30/6211; H10D 30/6219;
(Continued)

(56) References Cited

U.S. PATENT DOCUMENTS 9,117,839 B2 *   8/2015   Kizilyalli ............. H10D 30/831
2007/0025034 A1  2/2007   Chaudhary et al.
(Continued)

FOREIGN PATENT DOCUMENTS

DE   102019118515 A1    4/2020
TW      201310643 A *   3/2013

OTHER PUBLICATIONS

Tsai et al. TW-201310643-A, machine translation (Year: 2015).*
(Continued)

*Primary Examiner* — Andres Munoz
(74) *Attorney, Agent, or Firm* — Kevin B. Jackson

(57) ABSTRACT

A vertical fin-based field effect transistor (FinFET) device includes an array of FinFETs comprising a plurality of rows and columns of separated fins. Each of the separated fins has a length and a width measured laterally with respect to the length and includes a first fin tip disposed at a first end of the separated fin, a second fin tip disposed at a second end of the separated fin opposing the first end, a central region disposed between the first fin tip and the second fin tip and characterized by a first electrical conductivity, and a source contact electrically coupled to the central region. The first fin tip and the second fin tip are characterized by a second electrical conductivity less than the first electrical conductivity. The FinFET further includes a first gate region surrounding the first fin tip and a second gate region surrounding the second fin tip.

20 Claims, 14 Drawing Sheets

(51) Int. Cl.
*H10D 30/01* (2025.01)
*H10D 30/62* (2025.01)
*H10D 62/85* (2025.01)
*H10D 84/01* (2025.01)
*H10D 84/03* (2025.01)

(52) U.S. Cl.
CPC ..... *H10D 30/6211* (2025.01); *H10D 30/6219* (2025.01); *H10D 62/8503* (2025.01); *H10D 84/013* (2025.01); *H10D 84/0158* (2025.01); *H10D 84/038* (2025.01)

(58) Field of Classification Search
CPC .. H10D 30/0512; H10D 30/831; H10D 30/62; H10D 62/8503; H10D 62/117; H10D 62/343; H10D 64/512; H10D 84/834; H10D 84/8503; H10D 84/013; H10D 84/0158; H10D 84/038; H10D 84/117; H10D 84/343
See application file for complete search history.

(56) References Cited

U.S. PATENT DOCUMENTS

2021/0193846 A1\* 6/2021 Drowley .............. H10D 84/811
2021/0210624 A1\* 7/2021 Drowley ........... H01L 21/30612

OTHER PUBLICATIONS

Machine translation of Lee et al. German Patent Document DE 102019118515 A1 Jul. 2019 (Year: 2019).
U.S. Appl. No. 18/137,314, "Non-Final Office Action," Apr. 8, 2024, 7 pages.

\* cited by examiner

VERTICAL FIN-BASED FIELD EFFECT TRANSISTOR (FINFET) WITH NEUTRALIZED FIN TIPS

CROSS-REFERENCES TO RELATED APPLICATIONS

This application claims the benefit of U.S. Provisional Application No. 63/304,512, filed on Jan. 28, 2022, the contents of which are hereby incorporated by reference in their entirety for all purposes.

BACKGROUND OF THE INVENTION

Vertical power transistors, in which the current flows from the top surface of the transistor to the back or bottom surface of the transistor substrate, are commonly used for controlling high currents and high voltages, since they can be formed with a reduced area compared to devices in which current flow through the transistor is lateral.

III-nitride materials, and in particular, gallium nitride (GaN), allow vertical field effect transistor (FET)-based power transistors to be fabricated with high breakdown voltages (e.g., in excess of 1200 V) while offering significant reductions in the specific on-resistance (i.e., the on-resistance of the device multiplied by the device area) compared to silicon or silicon carbide materials.

Despite the progress made in the area of vertical power transistors, there is a need in the art for improved methods and systems related to vertical power transistors.

SUMMARY OF THE INVENTION

The present invention generally relates to the field of electronics, and more specifically to semiconductor manufacturing technology. In a particular embodiment, structures and methods of forming a fin-based field effect transistor (FinFET) with leakage improvement are provided. Embodiments of the present invention are applicable to a variety of different, vertical FET structures and gate configurations.

According to an embodiment of the present invention, a vertical fin-based field effect transistor (FinFET) device is provided. The vertical FinFET device includes an array of FinFETs comprising a plurality of rows and columns of separated fins. Each of the separated fins has a fin length and a fin width measured laterally with respect to the fin length and includes a first fin tip disposed at a first end of the separated fin, a second fin tip disposed at a second end of the separated fin opposing the first end, a central region disposed between the first fin tip and the second fin tip and characterized by a first electrical conductivity, and a source contact electrically coupled to the central region. The first fin tip and the second fin tip are characterized by a second electrical conductivity less than the first electrical conductivity. The vertical FinFET device also includes a first gate region laterally adjacent the first fin tip and a second gate region laterally adjacent the second fin tip.

In an embodiment, the vertical FinFET device also includes a first central gate region disposed on a first lateral side of each of the separated fins and a second central gate region disposed on a second lateral side of each of the separated fins. The first central gate region and the second central gate region are characterized by a third electrical conductivity. The first gate region and the second gate region can be characterized by a fourth electrical conductivity less than the third electrical conductivity. An area of the first fin tip can be between 1% and 10% of an area of each of the separated fins and an area of the second fin tip can be between 1% and 10% of an area of each of the separated fins. The separated fins can include a III-N semiconductor, for example, GaN. The first fin tip has a tip length and a ratio of the fin length to the tip length can be greater than 10:1, greater than 25:1, or greater than 100:1.

In some embodiments, forming the first fin tip and the second fin tip to have second electrical conductivity can be achieved using implantation of ions. In another embodiment, the second electrical conductivity can be achieved using a hydrogen plasma treatment. Alternatively, the fourth electrical conductivity of the first gate region and the second gate region can be achieved using implantation of ions. In another embodiment, the fourth electrical conductivity of the first gate region and the second gate region can be achieved using a hydrogen plasma treatment.

According to specific embodiment of the present invention, a method of fabricating a vertical fin-based field effect transistor (FinFET) device is provided. The method includes providing a III-N substrate structure, forming a patterned hard mask coupled to the III-N substrate structure, and forming an array of separated fins in the III-N substrate structure Each of the separated fins has a fin length and a fin width measured laterally with respect to the fin length. The method also includes forming a gate metal layer coupled to the III-N substrate structure, forming a mask coupled to the III-N substrate structure, and electrically neutralizing a first fin tip disposed at a first end of each of the separated fins and a second fin tip disposed at a second end of each of the separated fins opposing the first end. The method further includes forming a source contact electrically coupled to a central region of each of the separated fins. The central region is disposed between the first fin tip and the second fin tip.

In some embodiments, providing the III-N substrate structure comprises providing a III-nitride substrate, epitaxially growing a first III-nitride layer coupled to the III-nitride substrate, and epitaxially growing a second III-nitride layer coupled to the first III-nitride layer. Forming the patterned hard mask can include forming a hard mask layer on the second III-nitride layer and patterning the hard mask layer to form the patterned hard mask. Forming the array of separated fins can include etching the second III-nitride layer and a portion of the first III-nitride layer using the patterned hard mask to form a plurality of trenches and selectively regrowing a third III-nitride layer in the plurality of trenches. The central region can be characterized by a first electrical conductivity and the first fin tip and the second fin tip can be characterized by a second electrical conductivity less than the first electrical conductivity. The method can additionally include electrically neutralizing a first gate region laterally adjacent the first fin tip and a second gate region laterally adjacent the second fin tip. Electrically neutralizing the first gate region laterally adjacent the first fin tip and the second gate region laterally adjacent the second fin tip can include performing implantation of ions. Electrically neutralizing the first gate region laterally adjacent the first fin tip and the second gate region laterally adjacent the second fin tip can include performing a hydrogen plasma treatment. Forming the gate metal layer coupled to the III-N substrate structure can include forming a first central gate region disposed on a first lateral side of each of the separated fins and forming a second central gate region disposed on a second lateral side of each of the separated fins. The first central gate region and the second central gate region can be characterized by a third electrical conductivity. Additionally, the method can include electrically neutralizing a first gate region laterally adjacent the first fin tip and a second gate region laterally adjacent the second fin tip, wherein the first gate region and the second gate region are characterized by a fourth electrical conductivity less than the third electrical conductivity. An area of the first fin tip can be between 1% and 10% of an area of each of the separated fins, and an area of the second fin tip can be between 1% and 10% of an area of each of the separated fins. Electrically neutralizing the first fin tip and the second fin tip can include performing implantation of ions or performing a hydrogen plasma treatment. The separated fins can include a III-N semiconductor such as GaN. The first fin tip has a tip length and a ratio of the fin length to the tip length that can be greater than 10:1, greater than 25:1, or greater than 100:1.

Numerous benefits are achieved by way of the present disclosure over conventional techniques. For example, embodiments of the present disclosure provide methods and systems that provide leakage improvement in arrays of gate-all-around vertical transistors. These and other embodiments of the disclosure, along with many of its advantages and features, are described in more detail in conjunction with the text below and corresponding figures.

DETAILED DESCRIPTION OF SPECIFIC EMBODIMENTS

Figure 1:
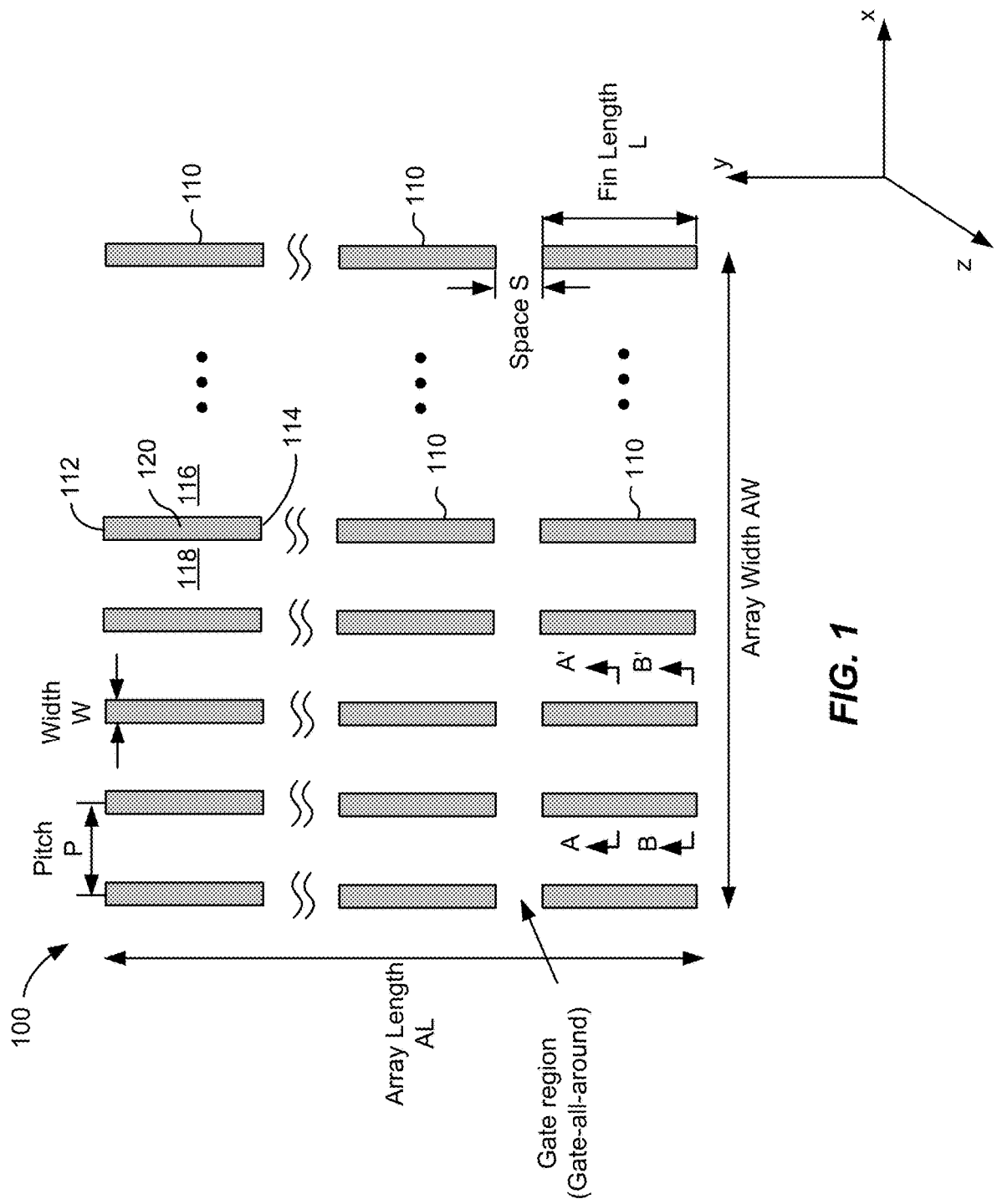
FIG. 1 shows an example of the plan view layout of an array of fins surrounded by a gate region according to an embodiment of the present invention.

The present invention generally relates to the field of electronics, and more specifically to semiconductor manufacturing technology. In a particular embodiment, structures and methods of forming a vertical fin-based field effect transistor (FinFET) with leakage improvement are provided. Embodiments of the present invention are applicable to a variety of different, vertical FET structures and gate configurations.

Power transistors that can withstand high voltages (>600 V) are becoming popular in applications such as industrial and commercial power supplies, solar inverters, and electric vehicles (EV) power trains. A key performance specification for such a transistor is to exhibit low leakage. High leakage causes higher power dissipation in the off-state and during switching. High leakage can also cause inefficient power conversion and device failure. As described herein, embodiments of the present invention reduce leakage associated with these high power transistors.

In addition, in order to reduce the resistance of the switch and reduce parasitic capacitances, etc., that limit switching speed, an increased conductance per unit area is desirable. Switch transistors in which the current flow is primarily vertical offer reduced resistance per area; this benefit can be further improved by arranging the control channel of the transistor to lie in the vertical direction, e.g., a "trench" channel transistor. The resistance of the transistor has several components, including the resistance of the transistor channel (i.e., the region where current is directly controlled by the input gate voltage), the resistance of the "drift" region (i.e., the region designed to hold the breakdown voltage of the transistor), and resistance of the starting substrate, contacts, metals, etc.

Transistors with a vertical current flow are typically designed with the drain contact at the bottom surface of the device and the gate and source contacts at the top surface of the device.

In order to maximize the switch conductivity (i.e., minimize the switch resistance) and provide a uniform transient response for the device, the transistor may be fabricated using an array of many, small vertical-channel switch devices surrounded by control gates (i.e., an array of "gate-all-around" transistors). The finished device has all sources connected to a single electrode, a common gate electrode, and a drain electrode.

Improvements in switch resistance and capacitance can be made by changing the semiconductor material from silicon to a wide bandgap material such as gallium nitride (GaN), which offers a higher critical field for breakdown. This allows the high-voltage drift region of the device to be made thinner and more heavily doped than with similar silicon devices, reducing the "specific resistance" (i.e., resistance× area) of the drift region, and reducing the device on-resistance for a given die size.

A vertical FET transistor structure is described in U.S. Pat. No. 9,117,839 (Kizilyalli, et al.) (the "'839 structure"), the disclosure of which is hereby incorporated by reference in its entirety for all purposes. In the '839 structure, the transistor conducting channel is formed using a semiconductor "fin" created by patterning and etching surrounding material to a certain depth. A semiconductor material with an opposite doping type is epitaxially regrown (e.g., using metalorganic chemical vapor deposition (MOCVD) to be substantially planar to the top of the semiconductor "fin"). The regrown material serves as the gate electrode of a vertical FET, and application of control voltages to the gate electrode modulates the conduction of current in the vertical "fin" channel between the top of the fin ("source") and bottom of the fin (normally, the drift region which is further connected to the "drain" electrode via the semiconductor substrate).

In the '839 structure, the regrown gate material surrounds the fin. An array of fins can be fabricated with a common gate using this approach, with, for example, fins arranged in a number of rows and columns so that the total number of transistors achieves the desired on-resistance target for the final device.

As mentioned above, the array of FinFETs includes a number of rows and columns of separated fins. Each of the separated fins has a length and a width measured laterally with respect to the length. A first fin tip is disposed at a first end of the separated fin, whereas a second fin tip is disposed at a second end of the separated fin opposing the first end. The first fin tip and the second fin tip are also referred to as the fin tips of the separated fin. A central region of the separated fin is disposed between the first fin tip and the second fin tip.

In vertically regrown junction field effect transistors (JFETs), the fin tips are a source of non-uniformity. First, the fin tips are defined by the combination of multiple planes. For best regrowth quality, the fin patterns are crystallographically aligned to the m-plane. But at the fin tips, the regrowth quality may be impacted due to growth on planes other than the m-plane. This variation in regrowth characteristics may cause a higher junction leakage between the gate and the source than desired.

Second, since fin tips are defined by the combination of multiple planes, etching using a tetramethylammonium hydroxide (TMAH) crystallographic etch can cause varying height at fin tips. This can cause regrown epitaxial overgrowth at fin tips and higher gate-source junction leakage.

Third, the uniformity of both the lithography process and the etch processes can vary significantly between a region with a regular pattern and a region with a sparse pattern. Such a transition occurs at the edges of the array of fins. For example, the presence of a large sparse area next to a regular array can lead to differences in exposure dose due to proximity effects, which will cause the resist linewidth to vary between the center of the array and the edges of the array, with a resulting increase in the electrical variation of the fin devices near the edge of the array. For example, the presence of a large sparse pattern area next to a regular pattern array can lead to differences in etch rate caused by variation in the amount of etchant consumed in the sparse pattern region vs. the amount consumed in the regular pattern array. Due to the difference in local pattern density (sparse patterns vs. dense patterns) at fin tips, there are non-uniformities in dry etch results due to different microloading. This can cause the overgrowth of the regrown epitaxial material and lead to higher gate-source junction leakage.

FIG. 1 shows an example of the plan view layout of an array of fins surrounded by a gate region according to an embodiment of the present invention. In FIG. 1, the gate metal is not shown. Further examples of arrays of fins suitable for FinFET arrays, including other layout concepts, may be found in U.S. Patent Application Publication No. 2021/0210624, the disclosure of which is hereby incorporated by reference in its entirety for all purposes.

In the example shown in FIG. 1, each of the separated fins 110 has a first fin tip 112 disposed at a first end and a second fin tip 114 disposed at a second end opposing the first end. A central region 120 is disposed between the first fin tip 112 and the second fin tip 114. A first central gate region 116 is disposed on a first lateral side (the right side in this example) of the separated fin, while a second central gate region 118 is disposed on a second lateral side (the left side in this example) of the separated fin. In the embodiments described herein, lateral dimensions are dimensions in the plane of FIG. 1, i.e., the x-y plane.

The length of the fin tip can be related to the length of the fin. As an example, the length of the first fin tip 112 and the second fin tip 114 can be on the order of 1 µm for fins with a fin length L of 25 µm, resulting in the length of the fin tip being 4% of the fin length. Thus, as described more fully below, the combined length (i.e., 2 µm) of the neutralization regions at the end of the fin (i.e., at the fin tips) is 8% of the fin length. In other embodiments, the length of the fin tip is shorter than 1 µm, for example, in the range of 0.2 µm to 0.4 µm, resulting in the combined neutralization regions at the end of the fin being between 1.6% and 3.2%. In some embodiments, the ratio of the fin tip length to the fin length is between 1% and 10%. Thus, the length of fin tip is sufficient to reduce electrical conductivity at the interface between the fin tip and the gate material laterally adjacent to the fin tip. The inventors have determined that lengths of the fin tip greater than or equal to about 0.05 µm, 0.1 µm, 0.2 µm, 0.3 µm, 0.4 µm, 0.5 µm, 0.75 µm, 1 µm, or 2 µm provide a sufficient decrease in electrical conductivity. Concurrently, the length of the fin tip is short enough to not significantly impact the power capabilities of the FinFET in an adverse manner.

Referring once again to FIG. 1, an array of fins (i.e., a fin array) 100 includes a plurality of separated fins 110 that are separated from each other by a fin pitch P. Thus, the distance between two adjacent fins, also referred to as separated fins, is referred to as a pitch P. Each fin has a width W and a fin length L. The array of fins has a fin array length AL measured in the Y-direction. Referring to FIG. 1, the bar-shaped fins are arranged in parallel to each other in the X-direction and extend along the Y-direction. The height of the fins is measured in the Z-direction extending out of the surface of the fin array (i.e., the X-Y plane).

In some embodiments, fin array 100 includes a plurality of separated fins 110 arranged in a plurality of rows (row 1, row 2, row 3) and in a plurality of columns (column 1, column, 2, . . . , column n). Each row is separated from each other row by a space S (i.e., the gap between each row). The total array length AL is related to the individual fin length L, the number of rows N, and the space S by AL=N*L+(N−1)*S. In one embodiment, the space S has a size equal to the pitch P. In another embodiment, the space S can have a size greater than a single pitch P (e.g., 1.2×P, 1.5×P, or 2×P). It is understood that the number of rows and the number of columns can be any integer number. In one embodiment, the number of columns in different rows may be different, for example, to enable "rounding" of the array for improved junction-terminated edge designs. In the example shown in FIG. 1, six fins are illustrated in each row. Accordingly, three rows and six columns are shown, but it is understood that the number of fins and the number of rows and columns are arbitrarily chosen for describing the example embodiment and should not be limiting.

In one exemplary embodiment, the fin length L is about 25 µm, the fin width W is about 0.2 µm, the fin thickness or fin height measured along the Z-direction is about 0.8 µm, and the pitch P is in the range between 1.5 µm and 2.5 µm. In one embodiment, a ratio between a fin width W and a pitch P between two adjacent fins is in the range between about 0.08 and 0.13, preferably in the range between 0.1 and 0.12. In one embodiment, a ratio between a fin length L and the pitch P between two adjacent fins is in the range between 5 and 25, preferably between 10 and 20, and more preferably between 12 and 16. In one embodiment, the fin length L is about 25 µm and the fin width W is in the range between 0.15 µm and 0.7 µm.

Figure 2:
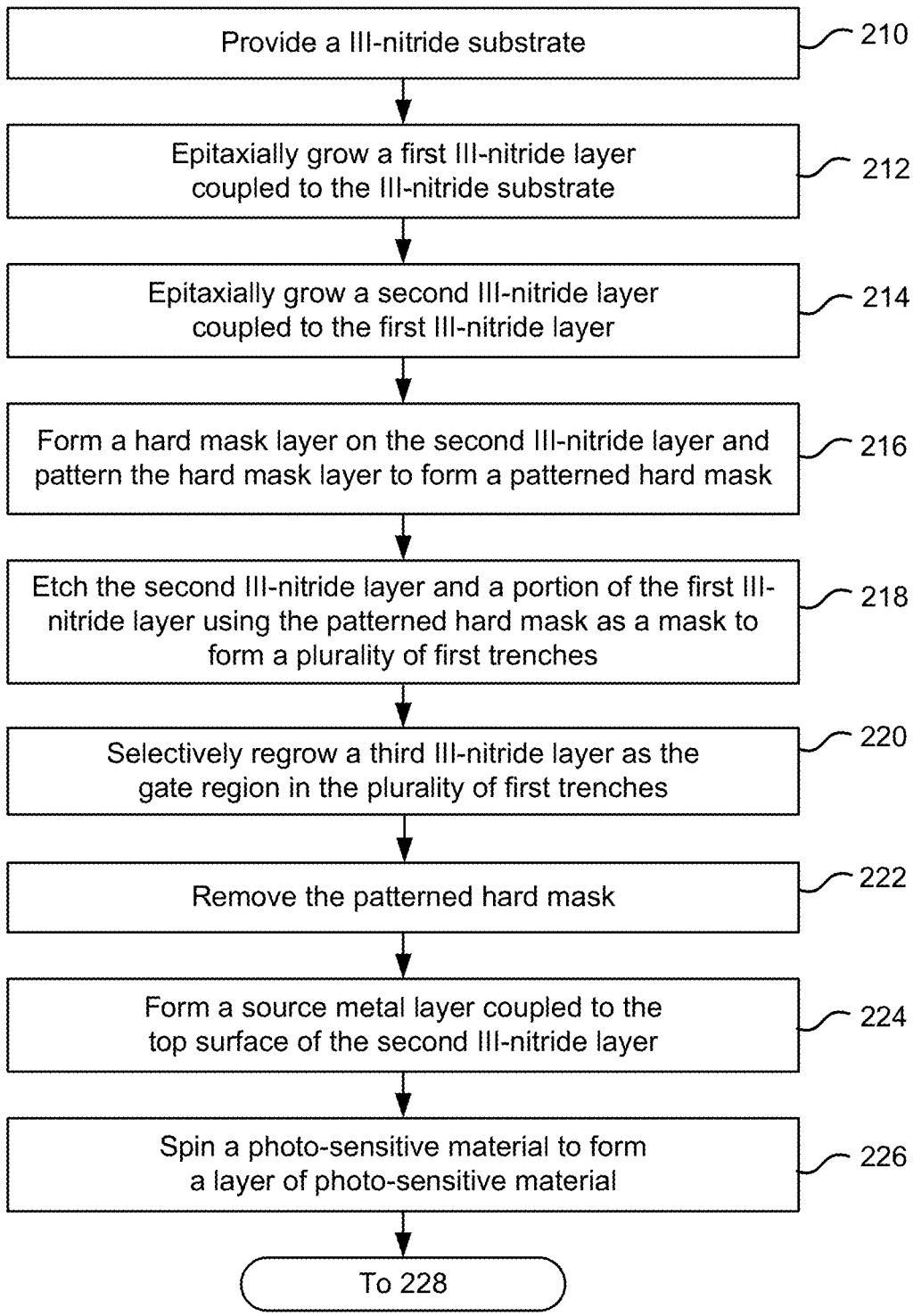
FIG. 2 shows a fabrication sequence for a vertical fin-based JFET using a regrown-gate approach according to an embodiment of the present invention.
Figure 2:
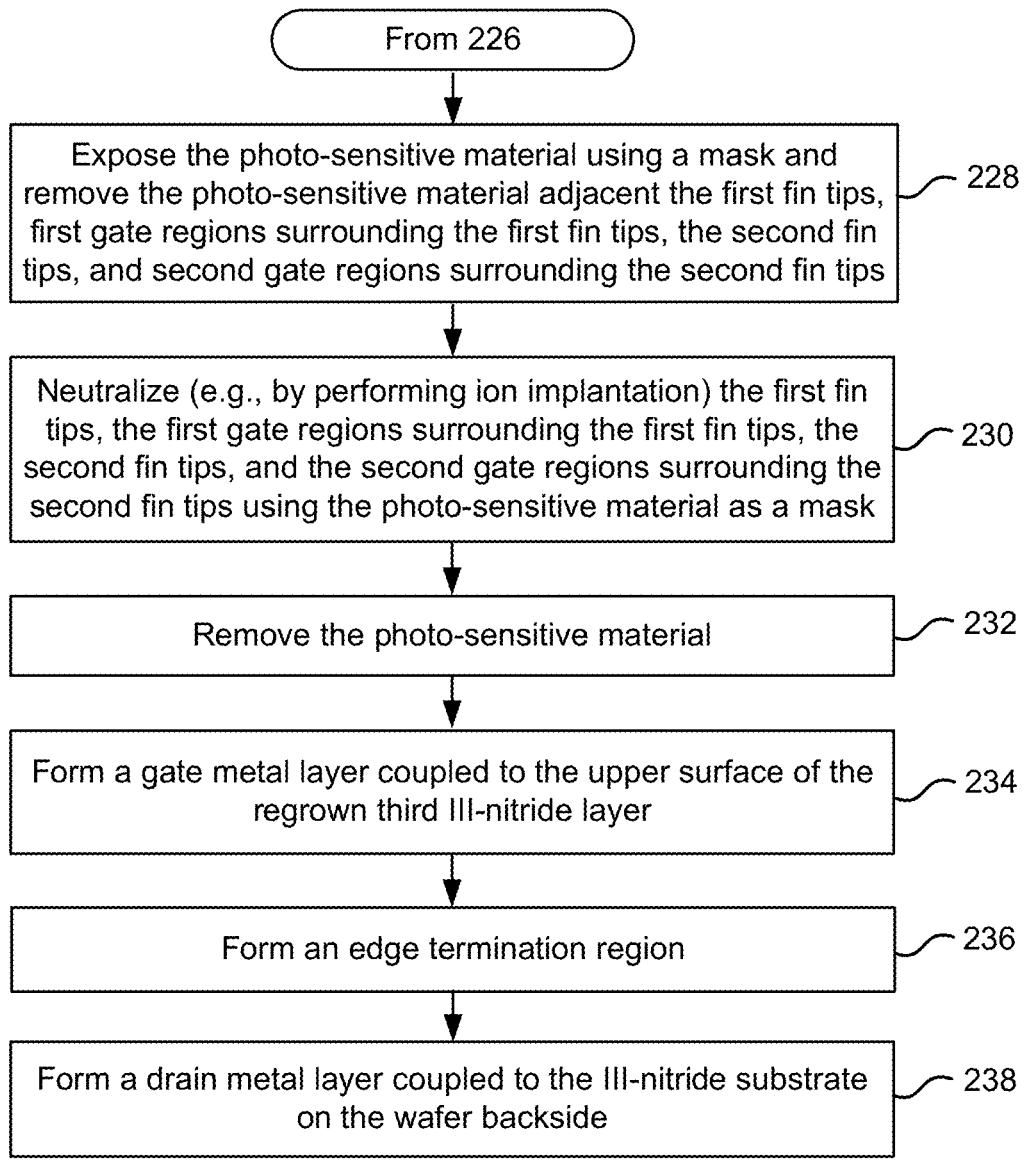

FIG. 2 shows a fabrication sequence for a vertical fin-based junction field effect transistor (JFET) using a regrown-gate approach according to an embodiment of the present invention. Further details related to the fabrication FinFET arrays may be found in U.S. Patent Application Publication No. 2021/0028312 and U.S. patent application Ser. No. 17/373,627, the disclosures of which are hereby incorporated by reference in their entirety for all purposes.

Figure 3A:
FIGS. 3A-3P are mimetic diagrams illustrating the process flow described in FIG. 2 according to an embodiment of the present invention.
Figure 3B:
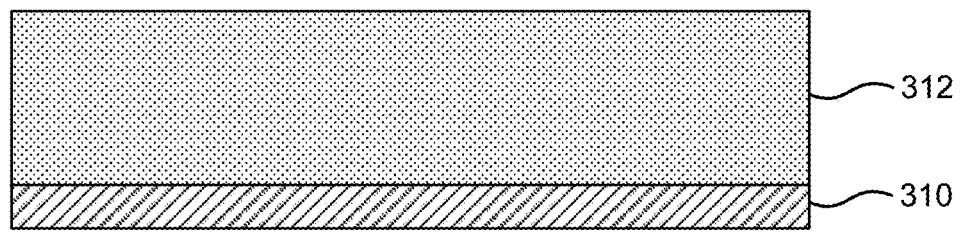
Figure 3C:
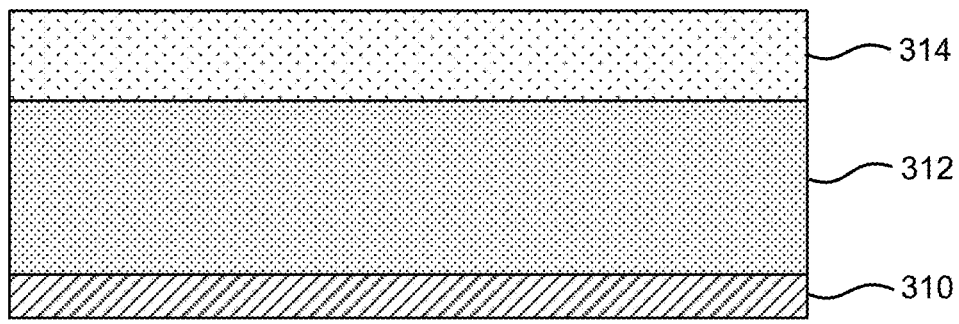
Figure 3D:
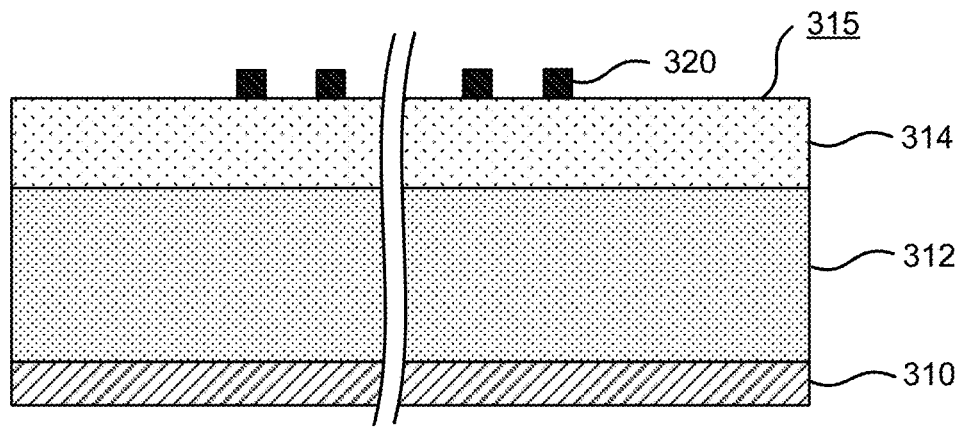
Figure 3E:
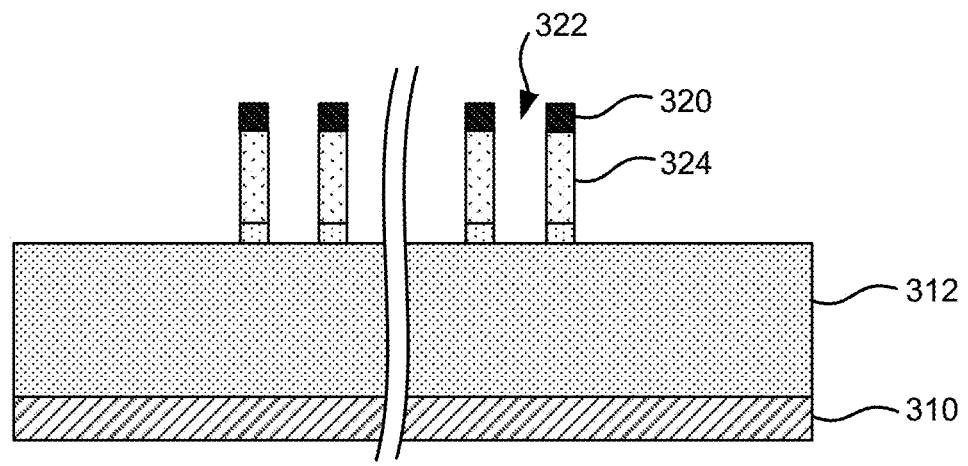
Figure 3F:
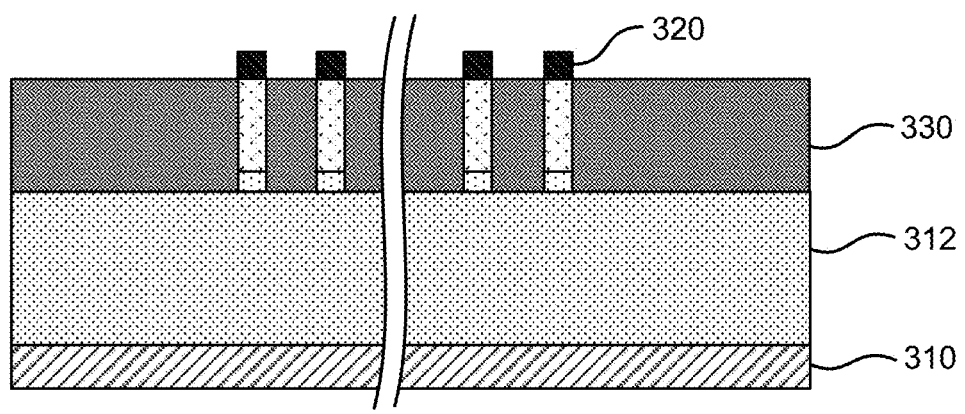
Figure 3G:
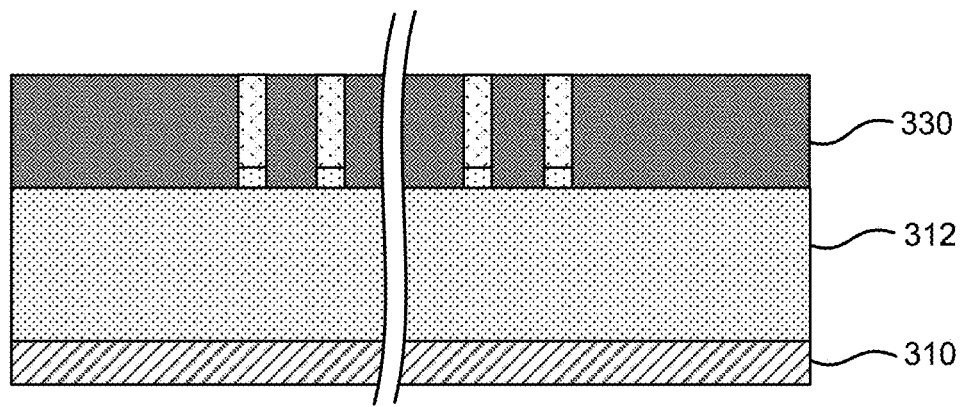
Figure 3H:
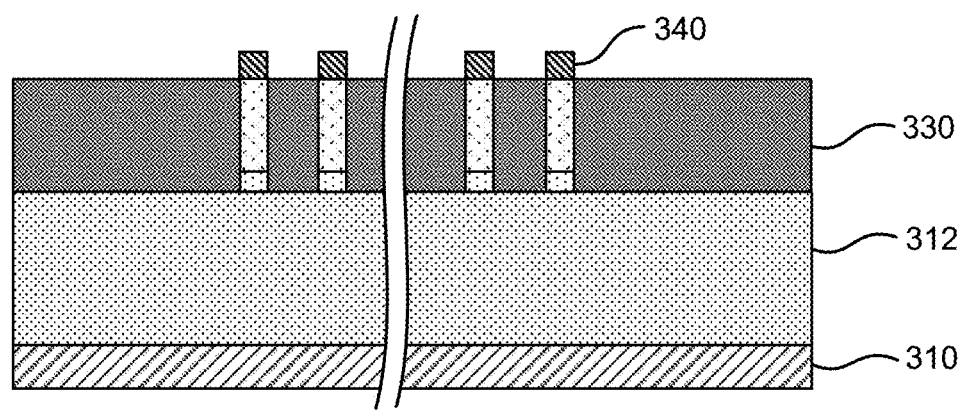
Figure 3I:
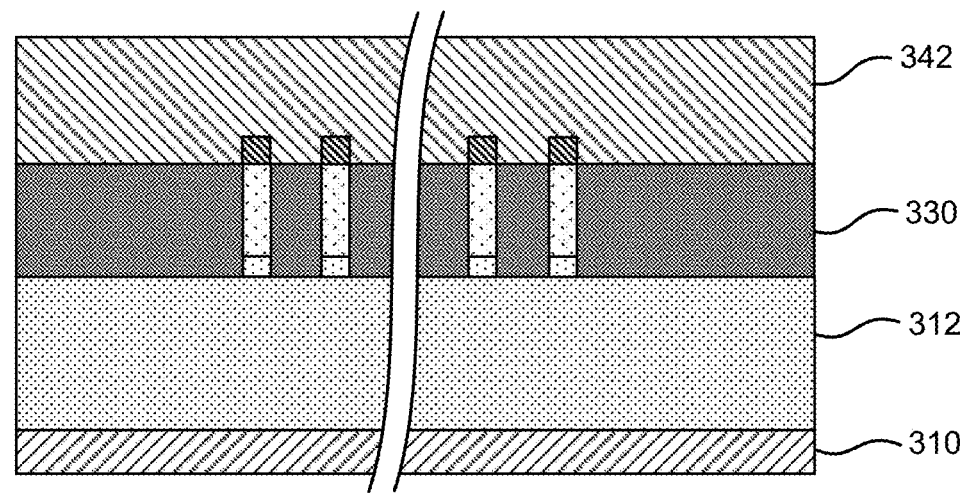
Figure 3J:
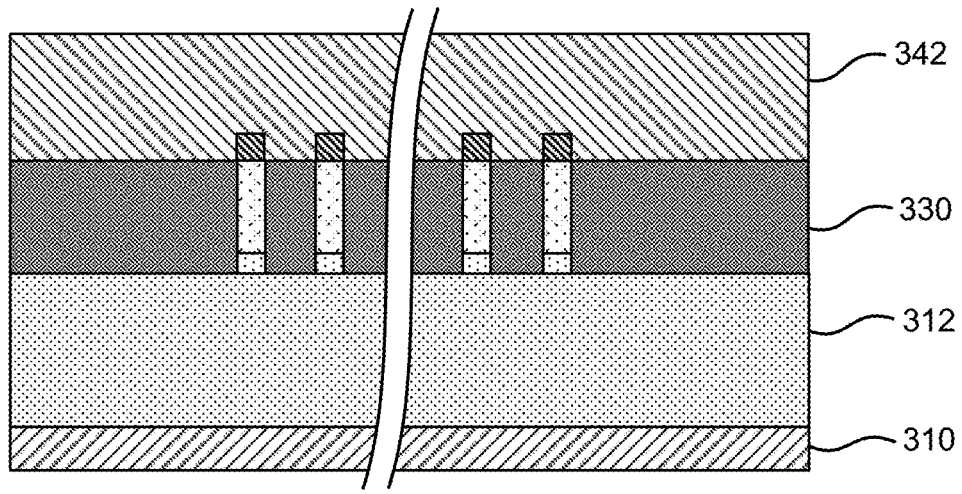
Figure 3K:
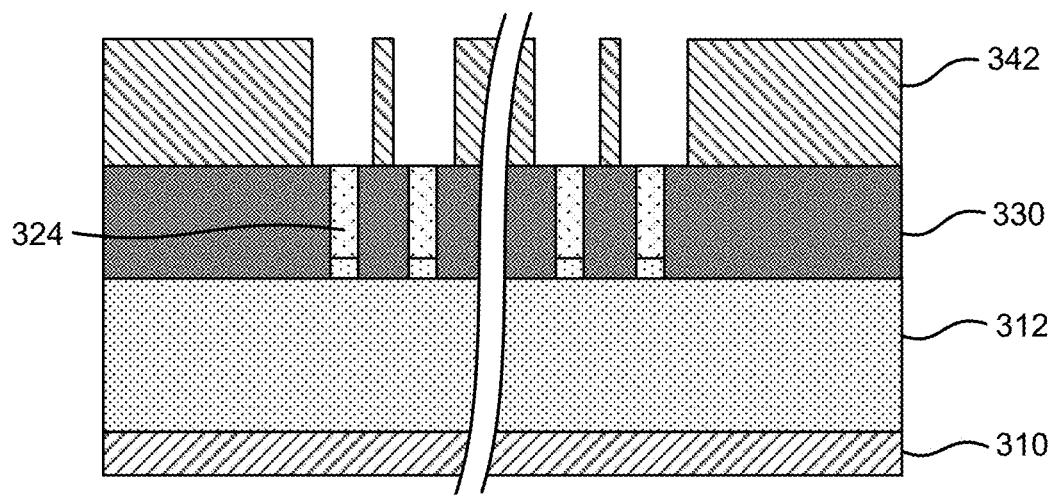
Figure 3L:
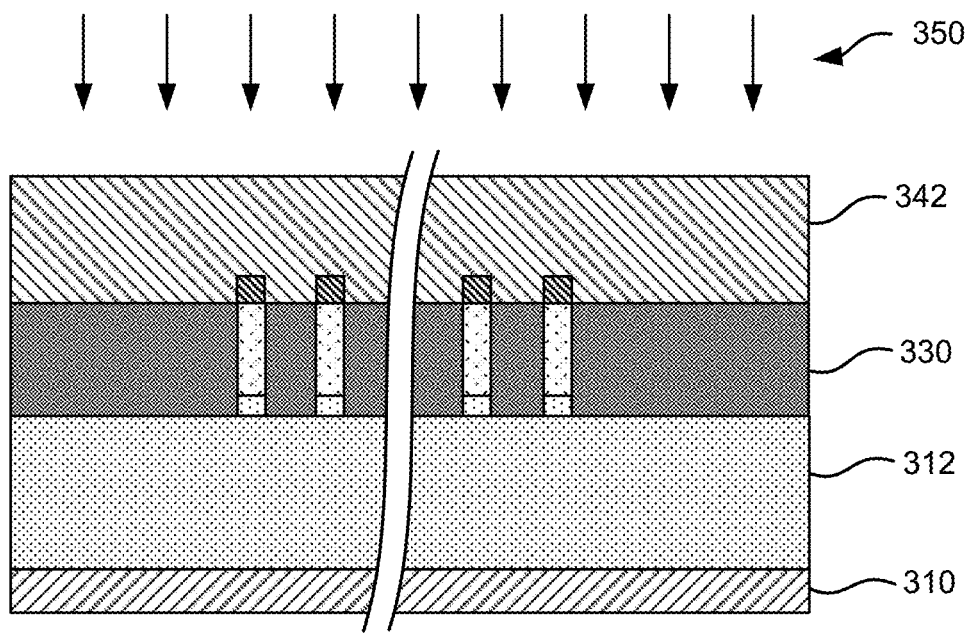
Figure 3M:
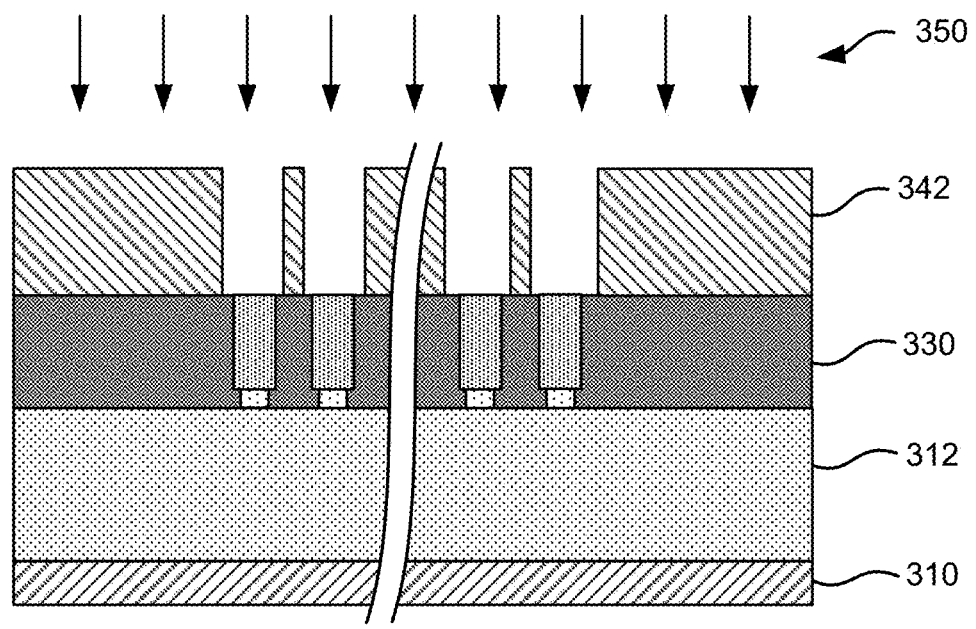
Figure 3N:
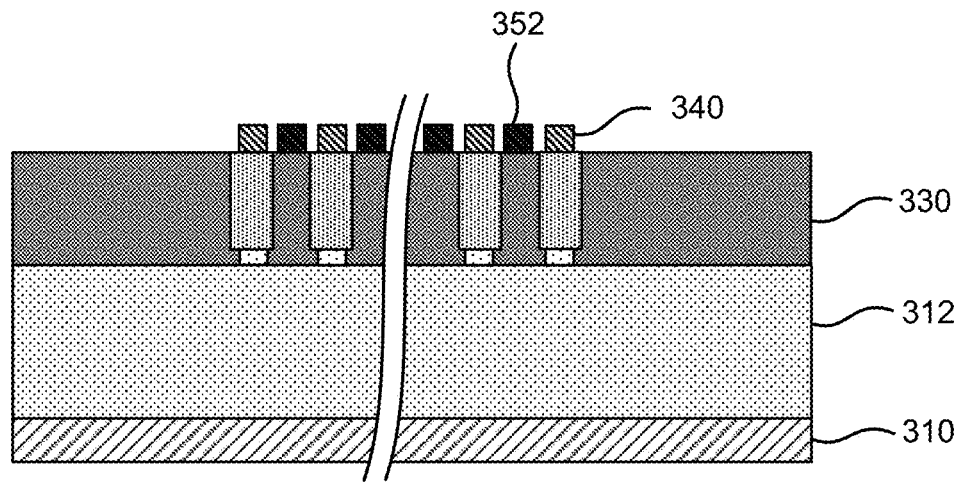
Figure 3O:
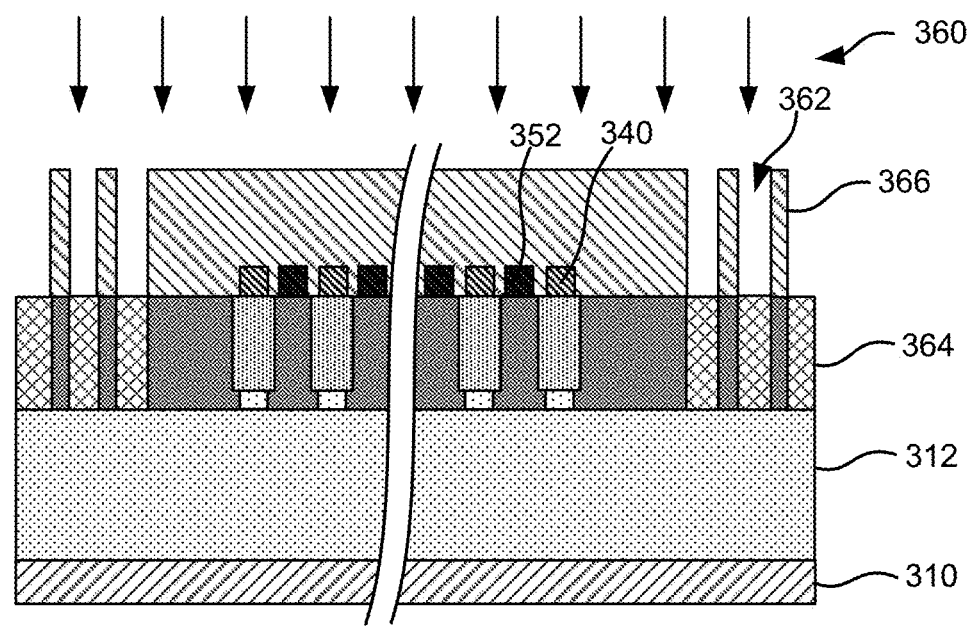
Figure 3P:
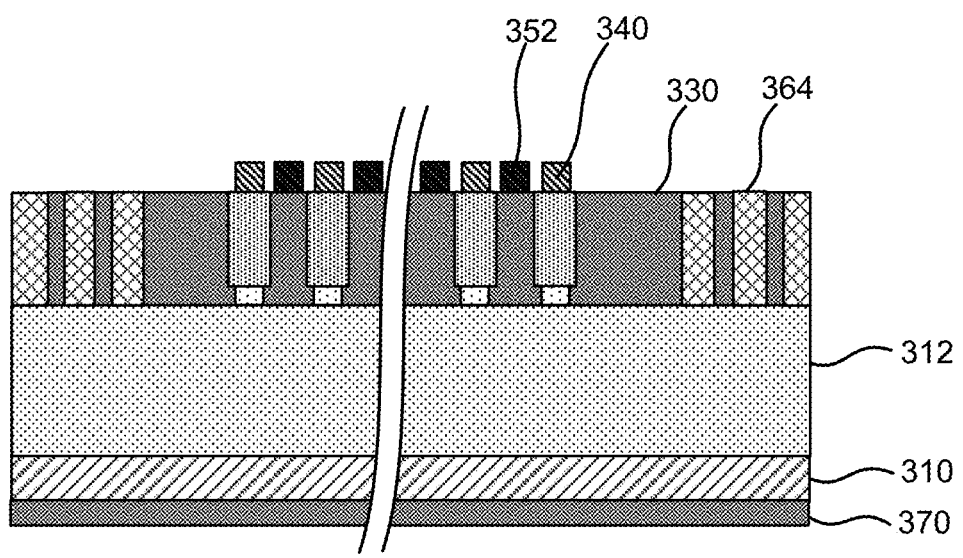

FIGS. 3A-3P are mimetic diagrams illustrating the process flow described in FIG. 2 according to an embodiment of the present invention.

Referring to FIG. 2 and FIGS. 3A-3P, method 200 includes providing a III-nitride substrate (210), illustrated as III-N substrate 310 in FIG. 3A. In an embodiment, the III-nitride substrate is n-GaN. In some embodiments, the III-N substrate 310 includes one or more epitaxial layers, although this is not required. In some embodiments, the III-N substrate 310 is an n+ GaN substrate having a resistivity of about 0.014±0.0025 ohm-cm. In some embodiments, the III-N substrate 310 is an n+ GaN substrate doped with one or more of oxygen, silicon, or germanium.

The method 200 also includes epitaxially growing a first III-nitride layer coupled to the III-nitride substrate (212), illustrated as first III-nitride epitaxial layer 312 in FIG. 3B. In some embodiments, the first III-nitride epitaxial layer 312 is epitaxially grown on the III-N substrate 310 at a temperature between 950 and 1150° C. and is characterized by a first dopant concentration, e.g., n-type doping with a net dopant concentration of about $1 \times 10^{16}$ atoms/cm$^3$. In some embodiments, the first III-nitride epitaxial layer 312, which can be an n-GaN layer, is a drift layer including a uniformly doped region (layer) on the III-nitride substrate and a graded doping region (layer) on the uniformly doped region. In some embodiments, the uniformly doped region has a thickness of about 12 μm, and the graded doping region has a thickness of about 0.3 μm. In some embodiments, the uniformly doped region (layer) may have a dopant concentration of about $1 \times 10^{16}$ atoms/cm$^3$, and the graded doped region (layer) may have graded dopant concentrations increasing from $1 \times 10^{16}$ atoms/cm$^3$ to $1.3 \times 10^{17}$ atoms/cm$^3$. In some embodiments, the graded doped region can improve device electrical variability in the presence of manufacturing variations. In some embodiments, the surface of III-nitride substrate is miscut from the c-plane at an angle to facilitate high-quality epitaxial growth for high-voltage operation of the drift layer. Thus, first III-nitride epitaxial layer 312 can be an n-GaN layer that can serve as a drift region for the transistor.

The method 200 further includes epitaxially growing a second III-nitride layer coupled to the first III-nitride layer (214), illustrated as second III-nitride epitaxial layer 314 in FIG. 3C. In an embodiment, second III-nitride epitaxial layer 314 is n-GaN and serves as a channel region for the transistor. In some embodiments, the second III-nitride epitaxial layer 314 is epitaxially grown on the first III-nitride epitaxial layer 312 with a thickness of about 0.7 μm and is characterized by a second dopant concentration, e.g., n-type doping. The second dopant concentration is higher than the first dopant concentration in some embodiments. In some embodiments, the second dopant concentration is about $1.3 \times 10^{17}$ atoms/cm$^3$. In some embodiments, the doping concentration and thickness of the second III-nitride epitaxial layer 314 are designed to achieve the desired channel conduction, threshold voltage, and/or punch-through characteristics of the vertical FET device.

The method 200 additionally includes forming a hard mask layer on the second III-nitride epitaxial layer 314 and patterning the hard mask layer to form a patterned hard mask (216). Referring to FIG. 3D, patterned hard mask 320 is an exemplary mask that is formed on top surface 315 of second III-nitride epitaxial layer 314 and can be utilized in a subsequent etching process to define the fins. In some embodiments, patterned hard mask 320 can be a composite hard mask that includes a metal layer and a dielectric layer on the metal layer. In these embodiments, as will be evident to one of skill in the art, the composite hard mask is then patterned prior to performing etching processes. In some embodiments, the hard mask layer may include $Si_3N_4$ and can be formed with a thickness of about 400 nm using a plasma-enhanced chemical vapor deposition (PECVD) process at about 300° C. In some embodiments, patterned hard mask 320 may be formed using a reactive-ion etching (RIE) process with F-based chemistry.

Referring to FIG. 2, the method 200 includes etching the second III-nitride layer and a portion of the first III-nitride layer using the patterned hard mask as a mask to form a plurality of first trenches (218). Referring to FIG. 3E, a plurality of first trenches 322 are formed in second III-nitride epitaxial layer 314 and form a plurality of fins 324 disposed between adjacent trenches. Thus, in some embodiments, an etching process is performed using the patterned hard mask to etch the second III-nitride epitaxial layer 314 and a portion of the first III-nitride layer 312. In some embodiments, the etching process may include an RIE process with $Cl_2$-based chemistry. In some embodiments, the etching process extends approximately 0.1 μm into the graded zone of the first III-nitride epitaxial layer 312. After the etching process, a plurality of fins are formed in the second III-nitride epitaxial layer 314. In some embodiments, the III-nitride material is GaN. In some embodiments, the etching process may include a wet etch after the RIE etch, e.g., 25% trimethyl ammonium hydroxide (TMAH) by weight in water at 85° C., which anisotropically etches the III-nitride layer to form vertical sidewalls on the fins which are substantially parallel to the 1120 plane of the III-nitride crystal (the "m-plane").

The method 200 also includes selectively regrowing a third III-nitride layer as the gate region in the plurality of first trenches (220). An example of regrown third III-nitride layer 330 in the plurality of first trenches 322 is shown in FIG. 3F. Further details related to regrowing a third III-nitride layer in the plurality of first trenches may be found in U.S. Patent Application Publication No. 2021/0028312 and U.S. Patent Application Publication No. 2022/0020743, the disclosures of which are hereby incorporated by reference in their entirety for all purposes. In some embodiments, regrown third III-nitride layer 330 is p-GaN and serves as the gate for the transistors. Thus, in some embodiments, the regrown third III-nitride layer 330 has a conductivity type opposite the conductivity type of the first III-nitride epitaxial layer 312 and the second III-nitride epitaxial layer 314. For example, the third III-nitride layer may include p-doped GaN material.

It should be understood that the third III-nitride layer may be formed in the plurality of first trenches 322 as the gate region using other techniques in other embodiments. In an embodiment, forming the third III-nitride layer as the gate region can include implanting a gate region in the region between the fins, and optionally, in the sidewalls of the fins, where the conductivity type of the gate region is opposite that of the first and second III-nitride layers. In an embodiment, the gate region is p-type. These implantation methods are discussed in U.S. Provisional Patent Application Publication Nos. 2021/0399091, 2021/0407815, and 2022/0254918, the disclosures of which are hereby incorporated by reference in their entirety for all purposes. In another embodiment, forming the third III-nitride layer as the gate region can further include diffusing a gate region in the region between the fins (and optionally, in the sidewalls of the fins), where the conductivity type of the gate region is opposite that of the first and second III-nitride layers. In an embodiment, the gate region is p-type. In an embodiment, the dopant is diffused from a solid source. In an embodiment, the dopant is diffused from a gas-phase source. In an embodiment, the dopant is one of Mg, Zn or Be.

The method 200 further includes removing the patterned hard mask (222). An example of the structure, after the patterned hard mask has been removed, is shown in FIG. 3G.

The method 200 includes forming a source metal layer coupled to the top surface of the second III-nitride layer (224). Referring to FIGS. 3D and 3H, an example of source metal layer 340 coupled to top surface 315 of second III-nitride epitaxial layer 314 is illustrated. FIG. 3H is a cross-section diagram taken at A-A' shown in FIG. 1 (i.e., at the central regions). Unless otherwise specified, the cross-section diagrams are taken at A-A' shown in FIG. 1 (i.e., at the central regions of the separated fins). Thus, the source contacts formed using source metal layer 340 are coupled to the central regions of the separated fins. Accordingly, the first fin tip and the second fin tip of each separated fin as illustrated in FIG. 1 are exposed and not covered by the source metal layer.

In some embodiments, the source metal layer is formed by deposition through openings in a source mask layer. In some embodiments, the source metal layer is formed by deposition at a temperature of about 150° C. on the exposed upper surface of the plurality of fins. In some embodiments, the source metal layer may include a stack structure comprising a first source metal layer on the upper surface of fins, a second source metal layer on the first source metal layer, and a third source metal layer on the second source metal layer. In some embodiments, the first source metal layer includes Ti having a thickness of about 25 nm, the second source metal layer includes Al having a thickness of about 100 nm, and the third source metal layer includes Mo having a thickness of about 45 nm. After the deposition of the source metal layers, a source mask layer used during fabrication can be removed. In some embodiments, a rapid temperature annealing (RTA) treatment then may be performed in $N_2$ at 600° C. for 600 seconds. After the RTA treatment, the source metal layer will have a specific resistance of less than about $1 \times 10^{-5}$ ohm-cm$^2$.

The method 200 also includes spinning a photo-sensitive material to form a layer of photo-sensitive material (226), illustrated as photo-sensitive material 342 as shown in FIG. 3I.

The method 200 further includes exposing the photo-sensitive material using a mask and removing the photo-sensitive material adjacent the first fin tips, first gate regions surrounding the first fin tips, the second fin tips, and second gate regions surrounding the second fin tips (228). As described herein, removing the photo-sensitive material adjacent the first fin tips, the first gate regions surrounding the first fin tips, the second fin tips, and the second gate regions can include removing the photo-sensitive material above the first fin tips, the first gate regions surrounding the first fin tips, the second fin tips, and the second gate regions.

Thus, according to embodiments of the present invention, a masking step, which has openings in the mask in the regions around the fin tips and has mask material covering other portions of the FinFET array, is utilized. With this mask in place on the substrate structure, implantation can be performed using a neutral species to neutralize the fin tips and the area laterally adjacent the fin tips, making the fin tips electrically inactive in some embodiments. The masking layer is then removed from the wafer after the ion implantation process is performed.

Referring to FIG. 3J, which is a cross-section diagram taken at A-A' shown in FIG. 1 (i.e., at the central regions of the fins), the mask covers the portions of the photo-sensitive material in the central regions of the fins. As a result, photo-sensitive material 342 is not removed in the central regions of the fins. Referring to FIG. 3K, which is a cross-section diagram taken at B-B' shown in FIG. 1 (i.e., at the second fin tips), the fins 324 are exposed as well as a portion of the gate material (e.g., a portion of regrown third III-nitride layer 330) laterally adjacent (i.e., adjacent in either or both of the X-direction and/or the Y-direction) to the fin tips. Thus, as illustrated in FIG. 3K, the exposed fin tips (i.e., the second fin tips in this cross-section) and gate regions laterally adjacent the second fin tips are exposed once photo-sensitive material 342 above these areas has been removed. As described more fully herein, not only is the photo-sensitive material 342 removed to expose the second fin tips and the gate regions laterally adjacent the second fin tips, the first fin tips and the gate regions laterally adjacent the first fin tips are also exposed during the selective removal of the photo-sensitive material 342 illustrated in FIG. 3K.

Although a mask formed from photo-sensitive material is illustrated in the embodiments shown in FIGS. 3I-3K, other suitable mask layers can be formed and patterned to form other suitable masks as appropriate to the particular application. Accordingly, a mask formed using a photo-sensitive material is merely exemplary and other masks fabricated using other materials are included within the scope of the present invention.

The method 200 includes neutralizing, for example, by performing ion implantation, the first fin tips, the first gate regions surrounding the first fin tips, the second fin tips, and the second gate regions surrounding the second fin tips using the photo-sensitive material as a mask (e.g., as an implant mask) (230). Ion implantation is illustrated as an exemplary method of implementing neutralization, but as described below, ion implantation is merely exemplary. FIGS. 3L and 3M are cross-section diagrams taken at A-A' (i.e., at the central regions of the fins) and B-B (at the second fin tips), respectively, as shown in FIG. 1. As illustrated in FIG. 3L, the mask is present in the central region of the fins, resulting in ion implantation 350 not reaching the central regions, the source contacts electrically coupled to the central regions, and the first and second central gate regions that are covered by the mask of photo-sensitive material. As illustrated in FIG. 3M, since the mask exposes the fin tips (i.e., the second fin tips shown in this cross-section diagram) and the gate regions laterally adjacent the fin tips, ion implantation 350 reaches these exposed portions. Thus, the neutralization of the interface between the fin tips and the gate material laterally adjacent to the fin tips reduces the electrical conductivity at this interface, thereby reducing leakage. As discussed herein, neutralization does not require that the conductivity of the semiconductor material is equal to that of undoped material; rather, it includes reductions in conductivity compared to the conductivity of the material prior to a neutralization process. Thus, starting with a given doping level and initial conductivity in the second III-N layer making up the fins, the neutralization processes described herein can reduce the conductivity to a value lower than the value of the initial conductivity. As an example, neutralization as described herein includes a reduction in conductivity of at least 90%, at least 95%, at least 96%, at least 97%, at least 98%, at least 99%, at least 99.9%, at least 99.99%, at least 99.999%, at least 99.9999%, and the like. In other words, the sheet resistance value for the un-neutralized material (e.g., p-GaN material) can be on the order of 30 k$\Omega$/□ and the sheet resistance value for the neutralized material can be on the order $10^7$ $\Omega$/□, $10^8$ $\Omega$/□, $10^9\Omega$/□, or more, achieving a modification in the resistivity/conductivity of four orders of magnitude or more.

Neutralizing the fin tips as described herein reduces the electrical conductivity of the fin tips and the area laterally adjacent the fin tips, thereby reducing their electrical activity or making them electrically inactive, resulting in many advantages. First, the junction leakage is significantly reduced. Second, the complexity of the masking step, the implant step, and the photoresist strip step are low. Third, implant energies are well controlled and can be easily modified to achieve any desired neutralization depth. Fourth, this implant can be combined with an existing implant step of the right implant energy, making the whole process flow very efficient.

The ion implantation processes used herein implant ionic species to increase the resistivity (i.e., decrease the conductivity) of predetermined portions of the semiconductor layer to provide a spatial variation or modulation in the conductivity. Without limiting embodiments of the present invention, the inventors believe that the implantation process reduces the conductivity by at least one of the following mechanisms: compensating for dopants, annihilating dopants, increasing vacancy density, increasing void density, decreasing the total net charge in the epitaxial layer, or decreasing the density of ionized acceptors (donors for n-type material). Some or all of these mechanisms may provide for increased resistivity. Throughout the specification, reference is made to decreased conductivity or increased resistivity, which can also be referred to as a decrease in active charge, a decrease in active dopant species, or the like. Due to the robust nature of GaN-based materials, ion implantation can produce implanted ions interspersed with unchanged epitaxial material, effectively reducing the conductivity in an averaged sense, with voids or vacancies interspersed in the lattice with as-grown epitaxial material. The present invention is not limited by the physical mechanism resulting in the spatial conductivity modulation. Additionally, the mechanisms associated with ion implantation are also applicable to diffusion processes and hydrogen plasma treatments are appropriate.

In one embodiment, the neutralization process is an ion implantation process during which a neutralizing species is implanted into the areas exposed by the mask openings. The neutralizing species may be N, Ar, He, Si, or O, other suitable implant ions, or combinations thereof. In an embodiment, the dose of the neutralizing species is between $1 \times 10^{11}$ cm$^{-2}$ and $5 \times 10^{13}$ cm$^{-2}$. In an embodiment, the energy of the implantation is between 15 KeV and 700 KeV. In an embodiment, the energy of the implant for N is less than 500 KeV. In an embodiment, the energy of the implant for He is less than 200 KeV. In an embodiment, the energy of the implant for He is less than 170 KeV. In some embodiments, ion implantations with multiple energies are performed. In some embodiments, each of those ion implantations with multiple energies may have a different dose.

It should be understood that, although ion implantation is used as an example neutralization process, this is not intended to be limiting. In another embodiment, the neutralization process is a hydrogen plasma treatment process, which deactivates the dopant atoms in the p-GaN layer.

Thus, some embodiments of the present invention form a non-conducting region in the exposed GaN surface by neutralizing the first fin tips, the first gate regions surrounding the first fin tips, the second fin tips, and the second gate regions surrounding the second fin tips using the photo-sensitive material using ion implantation. Specifically, in these embodiments, an ion implantation process is performed to implant dopants into the regrown third III-nitride layer 330. The implanted dopants pass through the opening in the implantation mask and stop in a region of the third III-nitride layer that surrounds each of the fin tips. In some embodiments, the implant dopants may include nitrogen, helium, or argon.

In some embodiments, the ion implantation process may introduce compensating donor levels in the third III-nitride layer to form the neutralized regions as a semi-insulating III-nitride region. In such embodiments, dopants may include oxygen and silicon. Such dopants may also introduce damage and traps into the third III-nitride layer.

In some embodiments, the ion implantation process may implant metallic ions into the third III-nitride layer. In such embodiments, the implant dopants may introduce deep levels in the third III-nitride layer to form the neutralized regions as a semi-insulating III-nitride region.

Such dopants may include iron, titanium, and nickel.

In some embodiments, the ion implantation process may implant ions that physically damage the crystal lattice of the third III-nitride layer to create the neutralized regions as a non-conducting region. The damage may be extreme enough to create amorphous III-nitride material. A variety of ions can be used for this purpose, as long as the total dose is high enough to damage the III-nitride material.

The method 200 also includes removing the photo-sensitive material (232) as illustrated in FIG. 3N.

The method 200 further includes forming a gate metal layer coupled to the upper surface of the regrown III-nitride gate layer (234). An example of gate contacts 352 coupled to the upper surface of the regrown third III-nitride layer 330 is shown in FIG. 3N. In an embodiment, the work function of the metal is such that the metal gate electrode depletes the fin at zero bias as described in U.S. Patent Application Publication No. 2021/0407815, the disclosure of which is hereby incorporated by reference in its entirety for all purposes.

In some embodiments, the gate metal layer is formed by deposition through openings in a mask onto the exposed surface portion of the third III-nitride layer. In some embodiments, the gate metal layer may include a stack structure comprising a first gate metal layer on the surface portion of the third III-nitride layer, a second gate metal layer on the first gate metal layer, a third gate metal layer on the second gate metal layer, and a fourth gate metal layer on the third gate metal layer. In some embodiments, the first gate metal layer includes Ni with a thickness of about 20 nm, the second gate metal layer includes Au with a thickness of about 20 nm, the third gate metal layer includes Mo with a thickness of about 45 nm, and the fourth gate metal layer includes Au with a thickness of about 300 nm.

The method 200 includes forming an edge termination region (236). In some embodiments, a neutralizing implant is utilized to neutralize regrown III-nitride regions at the edges of the device. The photo-sensitive material utilized as a mask during the neutralizing implant at step 230 can be utilized in some embodiments. In other embodiments, an additional mask is utilized. Referring to FIG. 3O, an example of a process for forming an edge termination region and the resulting edge termination region is shown. In this embodiment, openings 362 in photo-sensitive material 366 allow ion implantation 360 to form reduced conductivity regions 364 in regrown third III-nitride layer 330. Photo-sensitive material 366 can be the same mask as that formed by photo-sensitive material 342 or a different mask. Thus, in the illustrated embodiment, the edge termination region is formed by implanting the exposed regrown III-nitride region at the edges of the device. Further details related to forming the edge termination region may be found in U.S. Provisional Patent Application Publication Nos. 2022/0013626 and 2022/0238643, the disclosures of which are hereby incorporated by reference in their entirety for all purposes. As illustrated in FIG. 3O, the active region of the device is covered by photo-sensitive material 366 during the ion implantation 360, enabling the formation of the edge termination region at the periphery of the active region.

In some embodiments, the neutralizing implant utilized to neutralize the fin tips and the gate materials surrounding the fin tips can be utilized during formation of the edge termination region. In other embodiments, different implant processes, with different implant energies, different implant depths, different implanted ions, or the like can be utilized. One of ordinary skill in the art would recognize many variations, modifications, and alternatives.

The method 200 additionally includes forming a drain metal layer coupled to the III-nitride substrate on the wafer backside (238). An example of drain metal layer 370 is shown in FIG. 3P.

It should be understood that examples shown in FIGS. 2 and 3A-3P are not intended to be limiting. For example, in addition to bulk GaN substrates mentioned above, the substrate can be GaN on SiC or GaN on Si in other embodiments. As another example, instead of vertically regrown JFETs, the methods provided according to the present invention can also be applied to semiconductor devices such as lateral regrown transistors, implanted JFETs, diffused JFETs, and the like. As yet another example, instead of n-GaN as the fins and p-GaN as the regrown gate region, the JFET can be fabricated using p-GaN as the fins and n-GaN as the regrown gate region. Although some embodiments described herein are discussed in the context of GaN Fin-FETs, embodiments of the present invention are not limited to this particular semiconductor material and FinFETs fabricated in other materials can be utilized in conjunction with the methods and systems described herein, including materials that are not III-N semiconductor materials, such as silicon carbide, gallium oxide, or the like.

As an example, instead of nitrogen, other neutral species (e.g., argon, helium, or any combination of nitrogen, argon, and helium) can be used to perform ion implantation to neutralize the first fin tips, the first gate regions surrounding the first fin tips, the second fin tips, and the second gate regions surrounding the second fin tips. As another example, the implant depth can be controlled by changing implant energy. In one embodiment, the entire depth of the fins is fully implanted to neutralize the bottom of each fin. In another embodiment, shallow implantation is conducted, and the region close to the top surface of each fin is neutralized. In yet another embodiment, the implantation is intermediate between the full implant and shallow implantation.

It should also be understood that the sequence shown in FIG. 2 is not intended to be limiting. Steps 226, 228, 230, and 232 shown in FIG. 2 can be shifted in the process flow. In one example, steps 226, 228, 230, and 232 can be conducted between step 222 and step 224 (i.e., after removing the hard mask layer and before forming the source metal layer). In another example, steps 226, 228, 230, and 232 can be conducted between step 234 and step 236 (i.e., after forming the gate metal layer and before forming the edge termination region).

Figure 4:
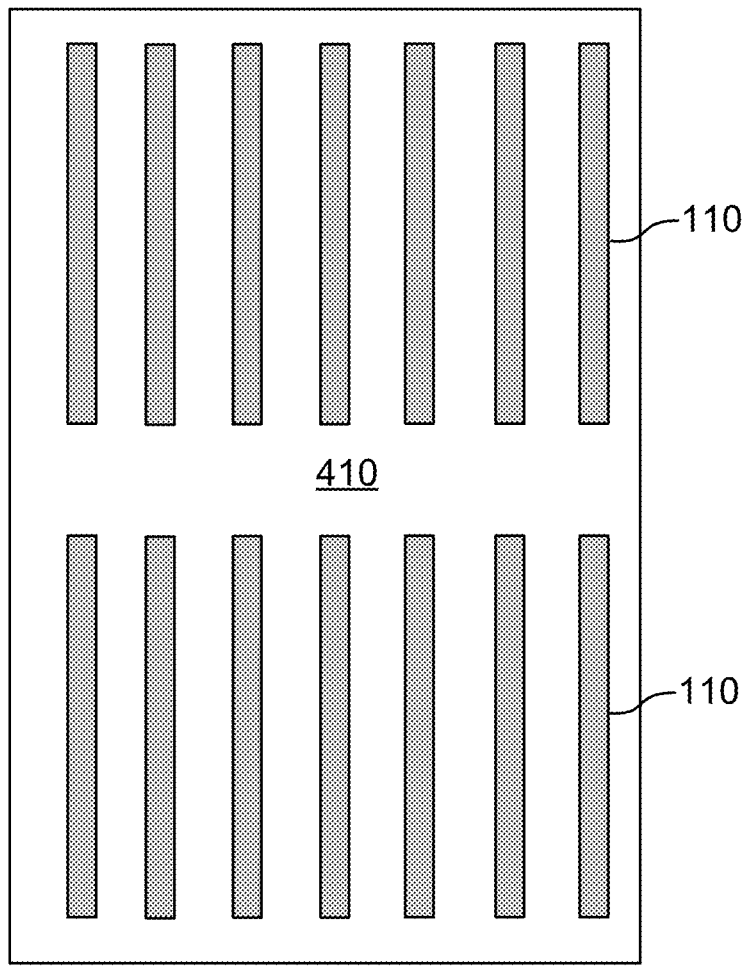
FIG. 4 is a plan view schematic diagram illustrating a layout of a fin array after regrowth of the III-nitride layer according to an embodiment of the present invention.

FIG. 4 is a plan view schematic diagram illustrating a layout of a fin array after regrowth of the III-nitride layer according to an embodiment of the present invention. In the example shown in FIG. 4, the array of separated fins 110 is surrounded by the gate region 410. At this stage of the fabrication process, and prior to ion implantation to neutralize the first fin tips, the first gate regions surrounding the first fin tips, the second fin tips, and the second gate regions surrounding the second fin tips as illustrated at process 350 in FIGS. 3L and 3M, the electrical conductivity in the separated fins does not vary. Neither does the electrical conductivity in the gate region vary. In other words, the first fin tip, the second fin tip, and the central region of each separated fin have the same electrical conductivity, while the first gate region, the second gate region, the first central gate region, and the second central gate region have the same electrical conductivity. As explained above, the fin tips are a source of non-uniformity, resulting in a higher junction leakage. Accordingly, embodiments of the present invention utilize a neutralizing ion implantation to reduce the conductivity of the first fin tips, the first gate regions surrounding the first fin tips, the second fin tips, and the second gate regions surrounding the second fin tips in order to reduce the junction leakage.

FIGS. 5A-5D show different variations of implant masks that can be utilized according to embodiments of the present invention. For the variations of implant masks illustrated in FIGS. 5A-5D, regions not covered by the implant mask receive the neutralization implant. In other words, those regions are characterized by a reduced electrical conductivity, which can correspond, in some embodiments, to a reduced doping density. Thus, the first fin tips and the second fin tips are characterized by a second electrical conductivity less than the electrical conductivity of the central regions. The first gate regions and the second gate regions are characterized by an electrical conductivity less than the electrical conductivity (e.g., the doping density) of the first central gate region and the second central gate region.

Figure 5A:
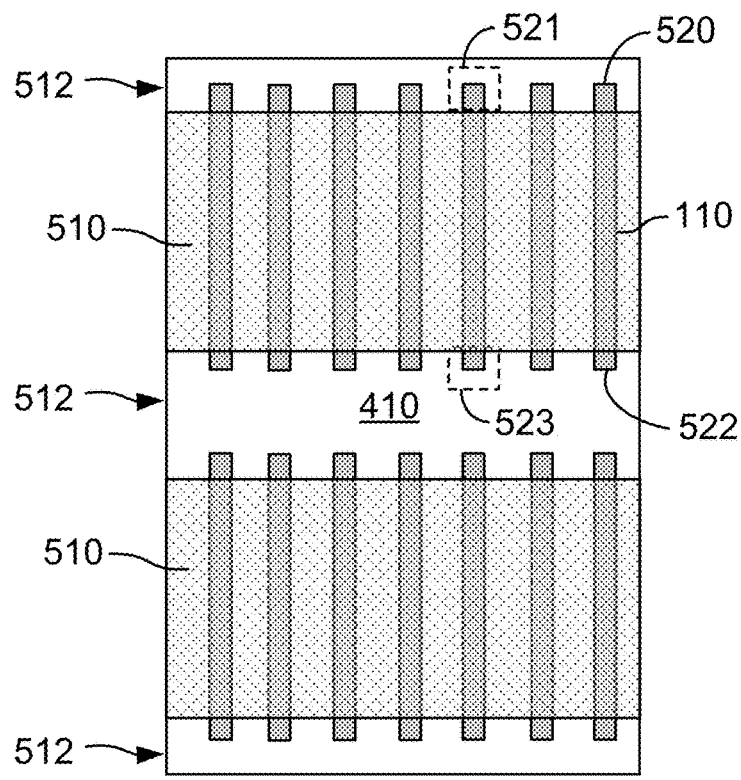
FIGS. 5A-5D show different variations of implant masks that can be utilized according to embodiments of the present invention.

Referring to FIG. 5A, implant mask 510 covers the central region of separated fins 110, as well as the gate material between the central regions of separated fins 110. The implant mask 510 has openings 512 that expose the first fin tips 520, the first gate regions 521 surrounding the first fin tips 520, the second fin tips 522, and the second gate regions 523 surrounding the second fin tips 522.

Figure 5B:
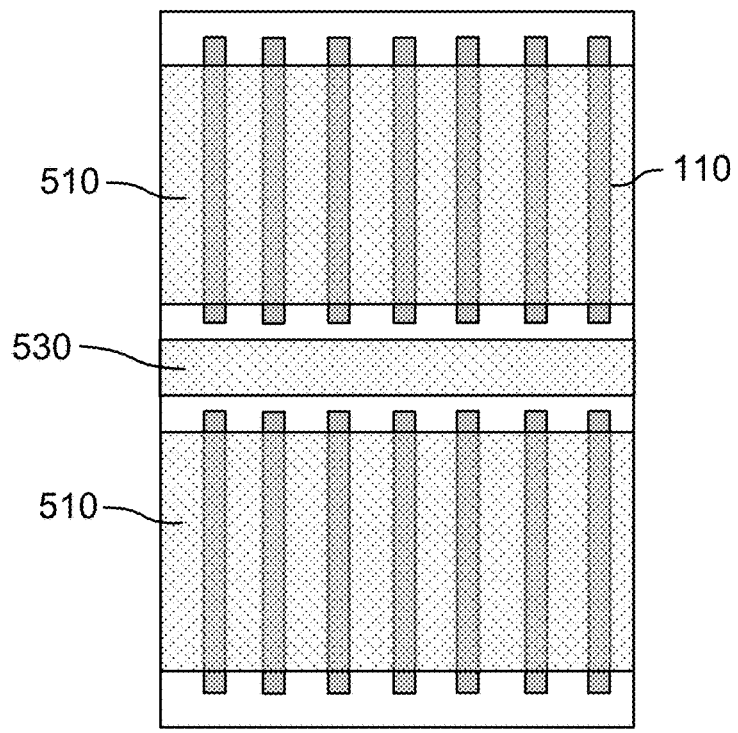

Referring to FIG. 5B, an additional implant mask 530 has been added between rows of fins and sections of implant mask 510. In the embodiment illustrated in FIG. 5C, additional implant masks 540 have been added between the fin tips, thereby increasing the implant mask area with respect to that shown in FIGS. 5A and 5B. Accordingly, in FIG. 5C, open areas of the implant mask correspond to the fin tips and the areas laterally adjacent the fin tips. The embodiment illustrated in FIG. 5D is similar to that shown in FIG. 5C, but with the removal of additional implant mask 530.

Figure 5C:
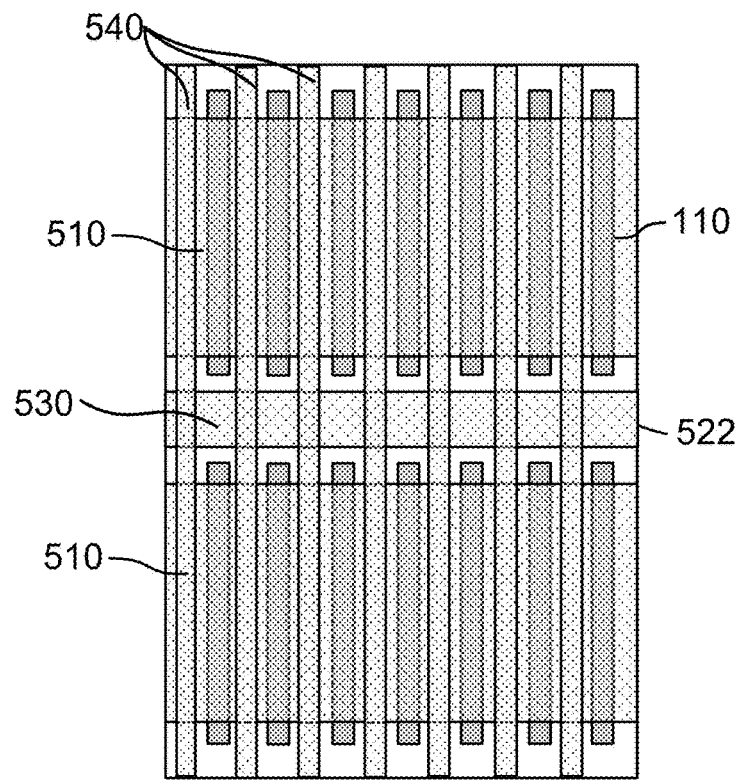
Figure 5D:
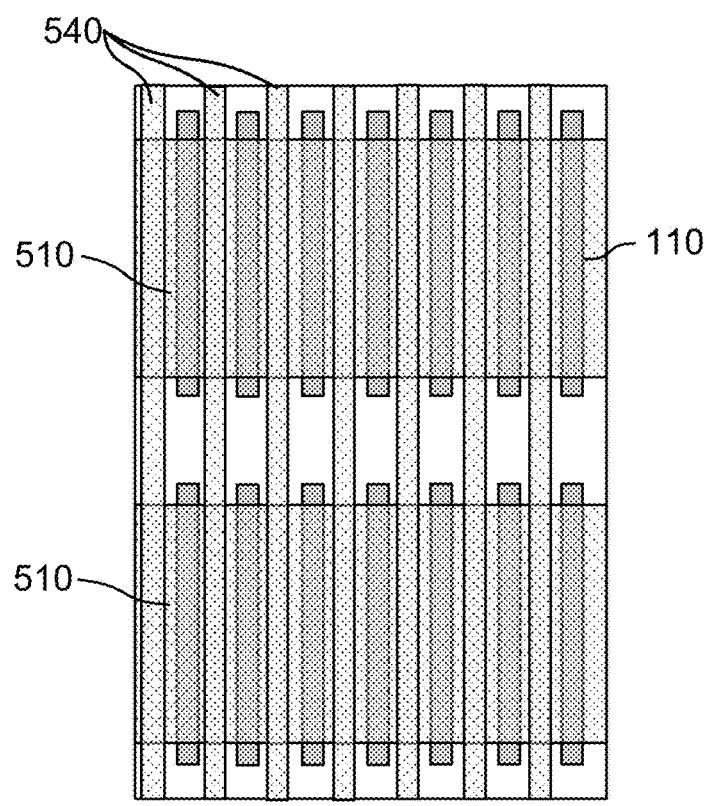

In some variations, as illustrated in FIG. 5C, the implant mask covers more area than the implant mask does in other variations, such as that illustrated in FIG. 5A. The inventors have determined that by using implant masks that cover a larger area, the electrical quality of the contact made by the gate metal can be improved since some of the gate regions are not neutralized. It should be understood that those variations shown in FIGS. 5A-5D are exemplary rather than limiting, and other variations can be employed.

While various embodiments of the invention have been described above, it should be understood that they have been presented by way of example only, and not by way of limitation. Likewise, the various diagrams may depict an example architectural or other configuration for the disclosure, which is done to aid in understanding the features and functionality that can be included in the disclosure. The disclosure is not restricted to the illustrated example architectures or configurations, but can be implemented using a variety of alternative architectures and configurations. Additionally, although the disclosure is described above in terms of various exemplary embodiments and implementations, it should be understood that the various features and functionality described in one or more of the individual embodiments are not limited in their applicability to the particular embodiment with which they are described. They instead can be applied alone or in some combination, to one or more of the other embodiments of the disclosure, whether or not such embodiments are described, and whether or not such features are presented as being a part of a described embodiment. Thus, the breadth and scope of the present disclosure should not be limited by any of the above-described exemplary embodiments.

It will be appreciated that, for clarity purposes, the above description has described embodiments of the invention with reference to different functional units and processors. However, it will be apparent that any suitable distribution of functionality between different functional units, processors or domains may be used without detracting from the invention. For example, functionality illustrated to be performed by separate processors or controllers may be performed by the same processor or controller. Hence, references to specific functional units are only to be seen as references to suitable means for providing the described functionality, rather than indicative of a strict logical or physical structure or organization.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; and adjectives such as "conventional," "traditional," "normal," "standard," "known", and terms of similar meaning, should not be construed as limiting the item described to a given time period, or to an item available as of a given time. But instead these terms should be read to encompass conventional, traditional, normal, or standard technologies that may be available, known now, or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to", or other like phrases in some instances shall not be read to mean that the narrower case is intended or required in instances where such broadening phrases may be absent.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A vertical fin-based field effect transistor (FinFET) device comprising:
   an array of FinFETs comprising a plurality of rows and columns of separated fins, each of the separated fins having a fin length and a fin width measured laterally with respect to the fin length and including:
      a first fin tip disposed at a first end of each of the separated fins;
      a second fin tip disposed at a second end of each of the separated fins opposing the first end;
      a central region disposed between the first fin tip and the second fin tip and characterized by a first electrical conductivity; and
      a source contact electrically coupled to the central region, wherein the first fin tip and the second fin tip are characterized by a second electrical conductivity less than the first electrical conductivity;
   a first gate region laterally adjacent the first fin tip; and
   a second gate region laterally adjacent the second fin tip.

2. The vertical FinFET device of claim 1 further comprising a first central gate region disposed on a first lateral side of each of the separated fins and a second central gate region disposed on a second lateral side of each of the separated fins, wherein the first central gate region and the second central gate region are characterized by a third electrical conductivity.

3. The vertical FinFET device of claim 2 wherein the first gate region and the second gate region are characterized by a fourth electrical conductivity less than the third electrical conductivity.

4. The vertical FinFET device of claim 1 wherein an area of the first fin tip is between 1% and 10% of an area of each of the separated fins and an area of the second fin tip is between 1% and 10% of an area of each of the separated fins.

5. The vertical FinFET device of claim 1 wherein the separated fins comprise a III-N semiconductor.

6. The vertical FinFET device of claim 1 wherein the first fin tip has a tip length and a ratio of the fin length to the tip length is greater than 10:1.

7. The vertical FinFET device of claim 6 wherein the ratio is greater than 25:1.

8. A method of fabricating a vertical fin-based field effect transistor (FinFET) device, the method comprising:
   providing a III-N substrate structure;
   forming a patterned hard mask coupled to the III-N substrate structure;
   forming an array of separated fins in the III-N substrate structure, wherein each of the separated fins has a fin length and a fin width measured laterally with respect to the fin length;
   forming a gate metal layer coupled to the III-N substrate structure;
   forming a mask coupled to the III-N substrate structure;
   electrically neutralizing:
      a first fin tip disposed at a first end of each of the separated fins; and
      a second fin tip disposed at a second end of each of the separated fins opposing the first end; and
   forming a source contact electrically coupled to a central region of each of the separated fins, wherein the central region is disposed between the first fin tip and the second fin tip.

9. The method of claim 8 wherein providing the III-N substrate structure comprises:
   providing a III-nitride substrate;
   epitaxially growing a first III-nitride layer coupled to the III-nitride substrate; and
   epitaxially growing a second III-nitride layer coupled to the first III-nitride layer.

10. The method of claim 9 wherein forming the patterned hard mask comprises:
   forming a hard mask layer on the second III-nitride layer; and
   patterning the hard mask layer to form the patterned hard mask.

11. The method of claim 10 wherein forming the array of separated fins comprises:
   etching the second III-nitride layer and a portion of the first III-nitride layer using the patterned hard mask to form a plurality of trenches; and
   selectively regrowing a third III-nitride layer in the plurality of trenches.

12. The method of claim 8 wherein:
   the central region is characterized by a first electrical conductivity; and
   the first fin tip and the second fin tip are characterized by a second electrical conductivity less than the first electrical conductivity.

13. The method of claim 8 further comprising electrically neutralizing:
   a first gate region laterally adjacent the first fin tip; and
   a second gate region laterally adjacent the second fin tip.

14. The method of claim 13 wherein electrically neutralizing the first gate region laterally adjacent the first fin tip and the second gate region laterally adjacent the second fin tip comprises performing implantation of ions.

15. The method of claim 13 wherein forming the mask comprises:
   providing a first mask portion that covers the central region of each of the separated fins,
   providing a first opening in the mask that exposes the first fin tip and the first gate region; and
   providing a second opening in the mask that exposes the second fin tip and the second gate region.

16. The method of claim 8 wherein forming the gate metal layer coupled to the III-N substrate structure comprises:
   forming a first central gate region disposed on a first lateral side of each of the separated fins; and
   forming a second central gate region disposed on a second lateral side of each of the separated fins, wherein the first central gate region and the second central gate region are characterized by a third electrical conductivity.

17. The method of claim 16 further comprising electrically neutralizing:
   a first gate region laterally adjacent the first fin tip; and
   a second gate region laterally adjacent the second fin tip,
   wherein the first gate region and the second gate region are characterized by a fourth electrical conductivity less than the third electrical conductivity.

18. The method of claim 8 wherein an area of the first fin tip is between 1% and 10% of an area of each of the separated fins, and an area of the second fin tip is between 1% and 10% of an area of each of the separated fins.

19. The method of claim 8 wherein electrically neutralizing the first fin tip and the second fin tip comprises performing implantation of ions in the presence of the mask.

20. The method of claim 8 wherein electrically neutralizing the first fin tip and the second fin tip comprises performing a hydrogen plasma treatment in the presence of the mask.

* * * * *